United States Patent
Ruque

(10) Patent No.: US 6,442,034 B1
(45) Date of Patent: Aug. 27, 2002

(54) FRONT FACE OF AN ELECTRONICS CARD AND AN ELECTRONICS CARD

(75) Inventor: Christian Ruque, Corbas (FR)

(73) Assignee: Alstom, Paris (FR)

( * ) Notice: Subject to any disclaimer, the term of this patent is extended or adjusted under 35 U.S.C. 154(b) by 7 days.

(21) Appl. No.: 09/612,361

(22) Filed: Jul. 7, 2000

(30) Foreign Application Priority Data

Jul. 12, 1999 (FR) .............................. 99 09201

(51) Int. Cl.⁷ ................................ H05K 7/14
(52) U.S. Cl. ................... 361/754; 361/753; 439/160; 439/923; 254/131; 29/758; 29/270; 29/267
(58) Field of Search .................. 29/758, 270, 278, 29/267; 254/104, 25, 131; 361/754, 798, 801, 759; 211/41.17; 439/157, 159, 160, 923, 152

(56) References Cited

U.S. PATENT DOCUMENTS

| | | | |
|---|---|---|---|
| 2,976,510 A | * | 3/1961 | Blain |
| T876,004 I4 | * | 7/1970 | Irvington et al. |
| 4,109,379 A | * | 8/1978 | Ratti et al. |
| 4,152,038 A | * | 5/1979 | Inouye et al. |
| 4,307,510 A | | 12/1981 | Sawyer et al. |
| 4,313,150 A | * | 1/1982 | Chu |
| 4,648,009 A | * | 3/1987 | Beun et al. |
| 5,225,962 A | * | 7/1993 | Neill et al. |
| 5,268,821 A | * | 12/1993 | Wong |
| 5,504,656 A | * | 4/1996 | Joist |
| 5,793,614 A | * | 8/1998 | Tollbom |
| 6,003,689 A | * | 12/1999 | Babineau et al. |
| 6,216,339 B1 | * | 4/2001 | Rich |

FOREIGN PATENT DOCUMENTS

| | | |
|---|---|---|
| DE | 2 743 977 A1 | 7/1997 |
| DE | 296 10 693 U1 | 8/1997 |
| FR | 2 599 927 A1 | 12/1987 |
| FR | 2 723 667 A1 | 2/1996 |
| JP | 06 302 979 | 10/1994 |

* cited by examiner

Primary Examiner—P. W. Echols
Assistant Examiner—Eric Compton
(74) Attorney, Agent, or Firm—Sughrue Mion, PLLC

(57) ABSTRACT

In this front face of an electronics card designed to be inserted into a housing through an opening, at least one of the edges of which opening is provided with a notched bar, that portion of said front face which is to be disposed in the vicinity of said bar is provided with at least one abutment surface for abutting against a drive member engaged through the notch when inserting said card into the housing or when extracting it therefrom. The method consists in inserting a drive member through one of the notches in said bar, in causing said member to bear against an abutment surface, and in exerting a pivot force on said drive member to pivot it about the zone via which it bears against an edge of the notch, so that a force is transmitted to the front face, at the abutment surface, in a direction corresponding to inserting the card or to extracting the card.

11 Claims, 4 Drawing Sheets

FRONT FACE OF AN ELECTRONICS CARD AND AN ELECTRONICS CARD

The invention relates to a front face of an electronics card, to an electronics card designed to be inserted into a housing, and to a method of inserting such a card into such a housing and of extracting it therefrom.

BACKGROUND OF THE INVENTION

It is known that it is possible to make housings in which electronics cards can be disposed side-by-side, such housings serving to constitute control or monitoring units for controlling or monitoring a variety of electrical equipment. Such a housing can be stationary or it can constitute a drawer, and, in general, its front face is provided with an opening through which the cards are inserted, while its back face is provided with connection means for co-operating with each of the cards.

In view of recent developments in the connection techniques used to connect cards, such techniques including "Compact PCI bus" type devices or connectors designed to the IEC 1076-4-101 Standard, the forces required to put such cards in place in a corresponding housing or to remove them therefrom are large since such cards are difficult to move, in particular at the end of insertion or at the beginning of extraction.

To mitigate that drawback, it is known, e.g. from U.S. Pat. No. 5,504,656 that the bottom portion of the front face of an electronics card can be hinged to a device provided with lugs organized to penetrate into notches in a bar disposed on the edge of the opening in the housing. A drive arm makes it possible to pivot the device relative to the notches. That device takes up a large amount of space on the front face of the card and, when a plurality of cards are juxtaposed in a housing, the corresponding devices form a relatively voluminous set of parts, and their unit cost is high compared with the cost of the card. In particular, in order to integrate a drive device in each front face, it is necessary to make said front face in a plurality of portions, and to fit a plurality of accessory parts such as a pin and assembly screws, which is both complex and costly. Unfortunately, such a device must be installed on each of the cards, which increases by a corresponding amount the cost of a control or monitoring unit equipped with a plurality of cards. In addition, when the lugs are engaged in the notches of the bar, the device masks one of the screws for fixing the card to the housing, thereby giving rise to a risk of forgetting to tighten that screw on inserting the card, it then not being impossible for the card to slip relative to the housing. In particular, no direct inspection can be made by an operator to check that the screw for fixing the card is properly tightened. In addition, such a device reduces the accessible area on the font face of the card, which makes it impossible to use standardized connectors that comply with a DIN standard and that are of low cost, and to install a centering device making it possible to form an "unpluggable" drawer, as described in FR-A-2 743 977. Finally, such a device must be adapted as a function of the type of connectors used between the card and the back face of the housing, so that it can happen that the same housing is equipped with different types of front faces and different types of such devices, which makes the housing relatively complex to manage, in particular for performing maintenance on an electronics unit.

OBJECTS AND SUMMARY OF THE INVENTION

An object of the invention is more particularly to remedy those drawbacks by proposing a novel structure for the front face of an electronics card, making the card easy to insert and to extract without having to use a complex special device such as a device known from the prior art.

To this end, the invention provides a front face of an electronics card designed to be inserted into a housing through an opening, at least one of the edges of which opening is provided with a notched bar, wherein that portion of said front face which is to be disposed in the vicinity of said bar is provided with at least one abutment surface for abutting against a drive member engaged through one of said notches when inserting said card into said housing or when extracting it therefrom.

By means of the invention, it is possible to terminate the card-insertion movement or to start the card-extraction movement by bearing against the surface provided for this purpose so that said surface is subjected to a strong force directed towards or away from the back of the housing. The drive member may be dimensioned such that it makes it possible to displace the card without excessive force, in particular by means of leverage. No permanent drive member is provided on the front face, thereby considerably reducing the cost of such a front face. Finally, the front face of the invention may be made in one piece, which gives it good rigidity.

In advantageous aspects of the invention, the front face incorporates one or more of the following characteristics:

It has two abutment surfaces that slope in different directions about a longitudinal plane, one of said abutment surfaces being suitable for co-operating with said drive member for the purpose of inserting said card into said housing, the other surface being suitable for co-operating with said drive member for the purpose of extracting said card. In which case, said two abutment surfaces slope relative to each other at an angle lying in the range 60° to 90°, and preferably about 70°. It is also possible to make provision for said abutment surfaces to be dimensioned and positioned relative to said front surface in a manner such that a common edge that is common to said abutment surfaces is disposed substantially facing the inside edge of a notch of said bar, when said card is installed in said housing. It is thus possible to insert the drive member through the notch to interact with one or other of its abutment surfaces, as a function of the desired direction of the force to be exerted on the front face and on the card.

The front face is provided with at least one abutment surface at each of its ends, namely its top end and its bottom end, which makes it possible to obtain the above-mentioned advantages at both edges of the opening in the housing when both of said edges are provided with notched bars.

The abutment surface is formed during molding of said front face. The front face is preferably made of Zamack (a zinc alloy) because this material offers good molding characteristics, good rigidity and good conductivity, even after nickel-plating. Thus, the marginal cost of such an abutment surface is zero because it is obtained without any extra cost relative to an operation of molding a state-of-the-art front face.

The abutment surface is provided slightly set back from a top edge or a bottom edge of said front face, in the thickness of said front face.

The invention also provides an electronics card designed to be put in place in a housing, and which is provided with a front face as described above. Such an electronics card is easier to handle than prior art electronics cards, while being more reliable and having a cost that is lower than cards equipped with devices such as the device known from U.S. Pat. No. 5,504,656.

The invention also provides a method of inserting an electronics card into a housing or of extracting it therefrom, an opening in the housing being provided with a notched bar. The method consists in inserting a drive member through one of the notches in said bar, in causing said member to bear against an abutment surface provided on a portion of the front face of said card, which portion is to be disposed in the vicinity of said bar, and in exerting a pivot force on said drive member to pivot it about its abutment zone via which it bears against an edge of said notch, so that a force is transmitted to said front face, at said abutment surface, in a direction corresponding to inserting said card or to extracting said card.

The method of the invention is particularly simple to implement because it is necessary merely to use a single drive member to put a plurality of cards in place successively in a housing or to extract a plurality of cards successively from a housing. The drive member is advantageously a screwdriver which, in any case, must be used to tighten or to loosen a fixing screw for fixing the card to the housing. Since leverage is used by pivoting or tilting the screwdriver about the zone via which it bears in the notch of the bar, a strong force can be transmitted to the front face, thereby making it possible to overcome opposing forces generated at the connection devices for connecting the card to the back face of the housing.

BRIEF DESCRIPTION OF THE DRAWINGS

The invention will be better understood and other advantages of the invention will appear more clearly on reading the following description of an embodiment of an electronics card of the invention and of a method of inserting it into a housing and of extracting it therefrom, given merely by way of example and with reference to the accompanying drawings, in which.

MORE DETAILED DESCRIPTION

Figure 1:
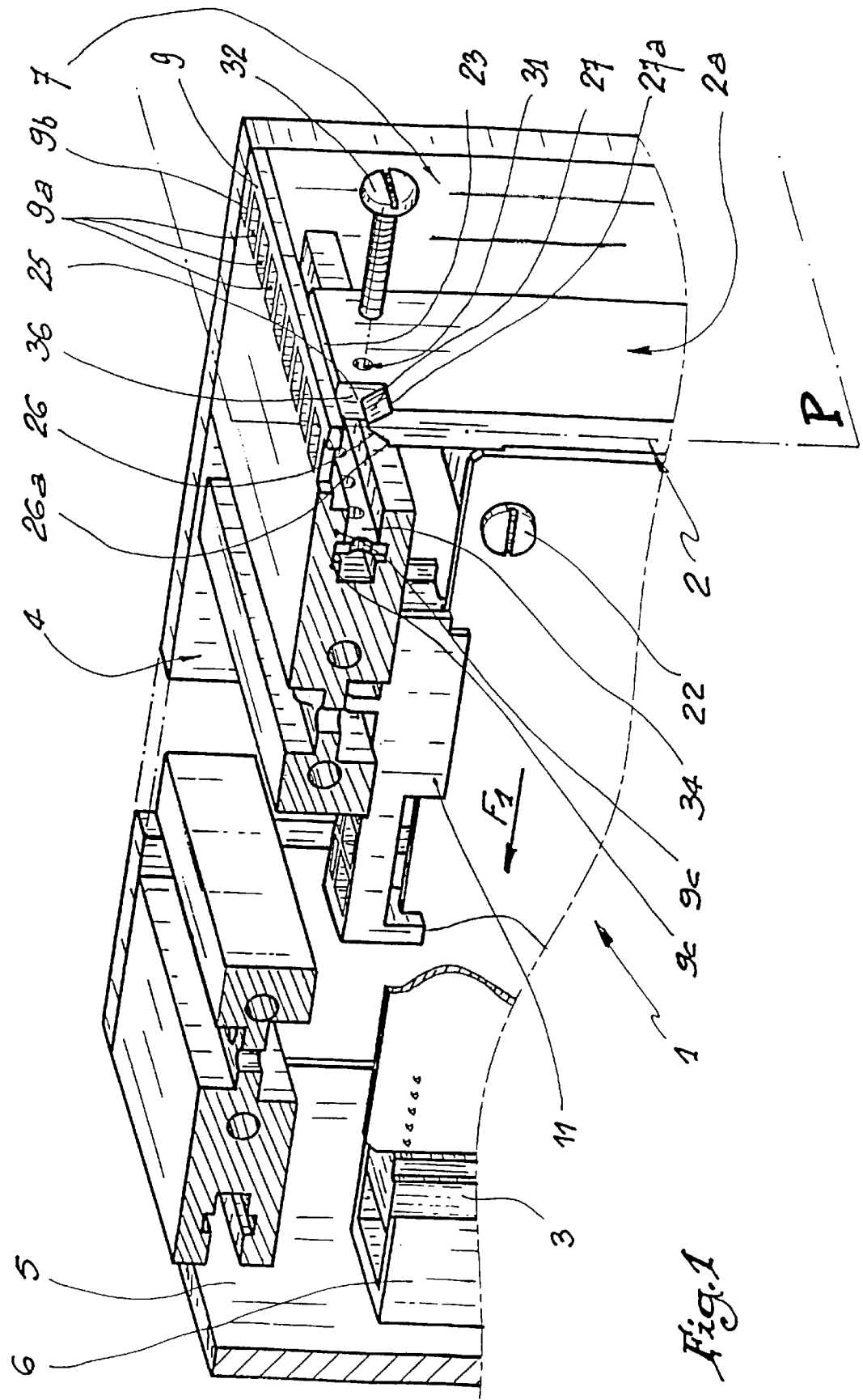
FIG. 1 is a fragmentary diagrammatic view of a card of the invention while it is being inserted into a housing.

The electronics card 1 shown in the figures is provided with a front face 2 and with connection means 3. It is designed to be put in place in a housing 4 whose back face 5 is equipped with connection means 6 suitable for co-operating with the means 3. The front face 7 of the housing 4 is provided with an opening 8 through which the card 1 is organized to be inserted until the means 3 and 6 co-operate effectively, it then being necessary for the card 1 to be held stationary in this position. The card-insertion movement is achieved essentially by pushing the front face 2 towards the back face 5 of the housing 4, as shown by the arrows $F_1$. This movement takes place by the card 1 sliding in two slideways 11 and 12 snap-fastened in the top and bottom portions of the housing and organized to receive and to guide the top and bottom edges of the card 1.

The top and bottom edges of the opening 8 are provided with respective notched bars 9 and 10, e.g. of the type specified in IEEE Standard No. P 1101.10.

The front face 2 is made of Zamack (a zinc alloy) by molding. It is fixed to the card 1 by screws, one of which can be seen in FIG. 1 at reference 22, so that said front face forms a single unit with said card.

The top and bottom edges of the front face 2 are respectively referenced 23 and 24. The edge 23 does not extend over the entire width of the front face 2 but rather it is provided with a setback 25 in which two surfaces 26 and 27 are formed, which surfaces slope relative to a longitudinal plane P of that portion of the front face 2 which contains the edges 23 and 24. The surfaces 26 and 27 are formed in the thickness e of the edge 23 and set back by a height h from the edge 23.

At their bottoms, i.e. where they join respectively the front main surface 2a and the back main surface 2b of the front face 2, the surfaces 26 and 27 are edged by respective plane margins 26a and 27a substantially perpendicular to the surfaces 2a and 2b.

In the same way, sloping surfaces 28 and 29 are provided in the vicinity of bottom edge 24 of the front face 2, in its thickness, and plane margins that edge them are referenced 28a and 29a.

Figure 2:
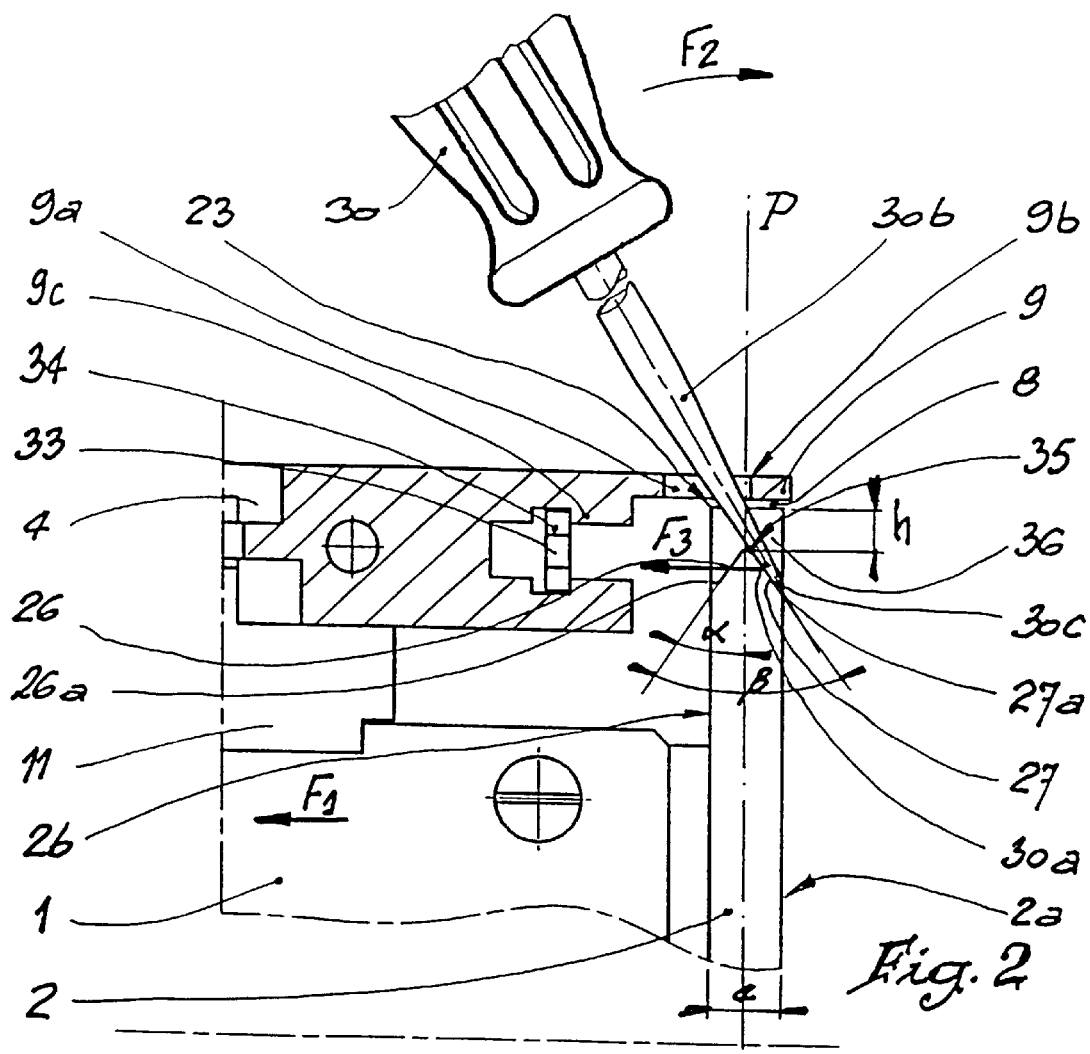
FIG. 2 is a fragmentary side view of the card shown in FIG. 1, during a final step of being inserted into the housing.
Figure 2:
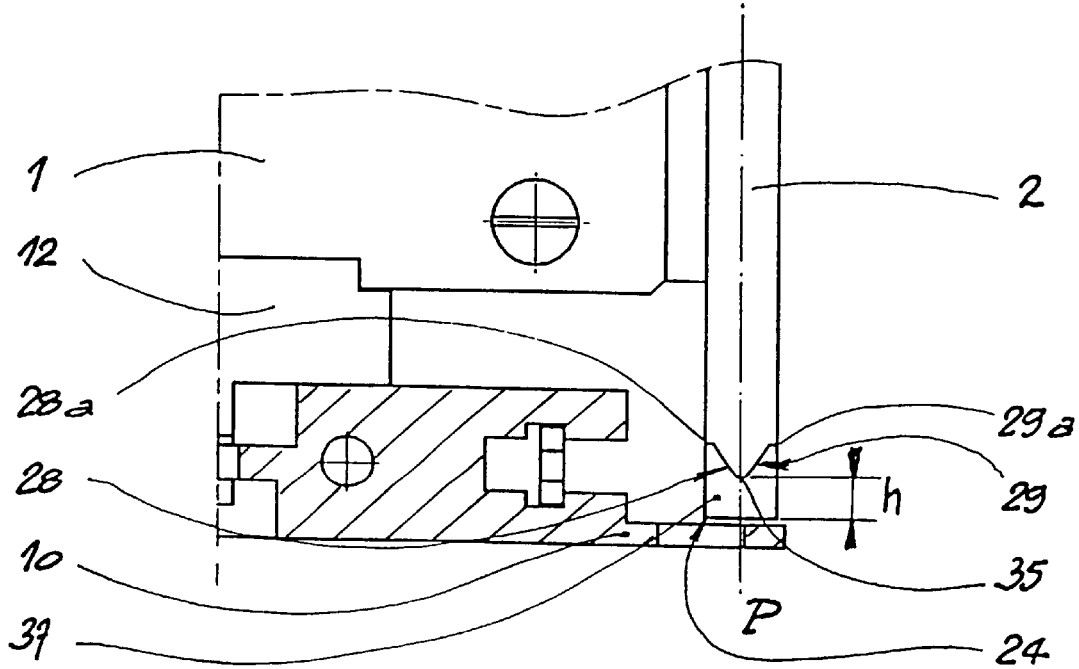

As shown more clearly in FIG. 2, each of the surfaces 26 and 27 slopes relative to the plane P at an angle $\alpha$ lying in the range 30° to 45°, and preferably equal to 35°. Thus, the angle $\beta$ of inclination at which the surfaces 26 and 27 slope relative to each other lies in the range 60° to 90°, and is preferably about 70°. The same applies to the surfaces 28 and 29.

When the card 1 has been presented in the housing 4 in a manner such that its connection means 3 are in the vicinity of or in contact with the connection means 6, it is necessary to overcome a strong opposing force in order to engage the co-operating means 3 and 6.

For this purpose, the end 30a of a screwdriver 30 is inserted through a notch 9a of the bar 9 while causing it to bear against the surface 27. The end 30a of the screwdriver 30 is inserted into the notch 9a until the tip edge 30c of the screwdriver 30 bears against the margin 27a. This makes it possible for the end 30a to be put in place against the surface 27 in "blind" manner. The shank 30b of the screwdriver 30 bears against that edge 9b of the notch 9a which is situated on the outside of the notch, i.e. which is further from the internal volume of the housing 4. Thus, pivoting or tilting the screwdriver 30 about the abutment zone in which the shank 30 abuts against the edge 9b, as represented by the arrow $F_2$, causes a force represented by the arrow $F_3$ and directed towards the back face 5 of the housing 4 to be transmitted to the surface 27 and thereby to the front face 2.

Considerable leverage is obtained by means of the screwdriver 30 insofar as the edge 9b of the notch 9a is close to the face 27 while the shank 30b of the screwdriver can be relatively long. That is why the force $F_3$ can be strong, and in particular sufficient to overcome the reaction forces opposing interconnection of the means 3 and 6. The surfaces 26 to 29 are substantially coplanar with the card 1, and therefore the force is transmitted between the screwdriver 30 and the card substantially in the plane of the card, no torsion force being generated at the front face 2. In practice, the force $F_3$ is coplanar with the top and bottom edges of the card 1, thereby making it easier for them to slide in the slideways 11 and 12. The force exerted by the user on the screwdriver 30 can thus be relatively small.

As shown more clearly in FIG. 1, an orifice 31 is provided in the front face 2 for passing a screw 32 for fixing to the edge 8a of the opening 8, the screw 32 serving to penetrate into a tapped hole 33 provided for this purpose in a strip 34 held in position in the bar 9 by sills 9c formed by extruding the bar. Thus, putting a card 1 in place requires the use of a screwdriver for tightening the screw 32 into position. It is therefore natural for the operator to have such a screwdriver, so that the above-described method, making it possible to exert a large force on the front face 2, is implemented without using any special tools.

Furthermore, the orifice 31 in the front face 2 remains permanently visible to the operator who is not hindered when driving the screw 32 and when inspecting that it is properly tightened.

Figure 3:
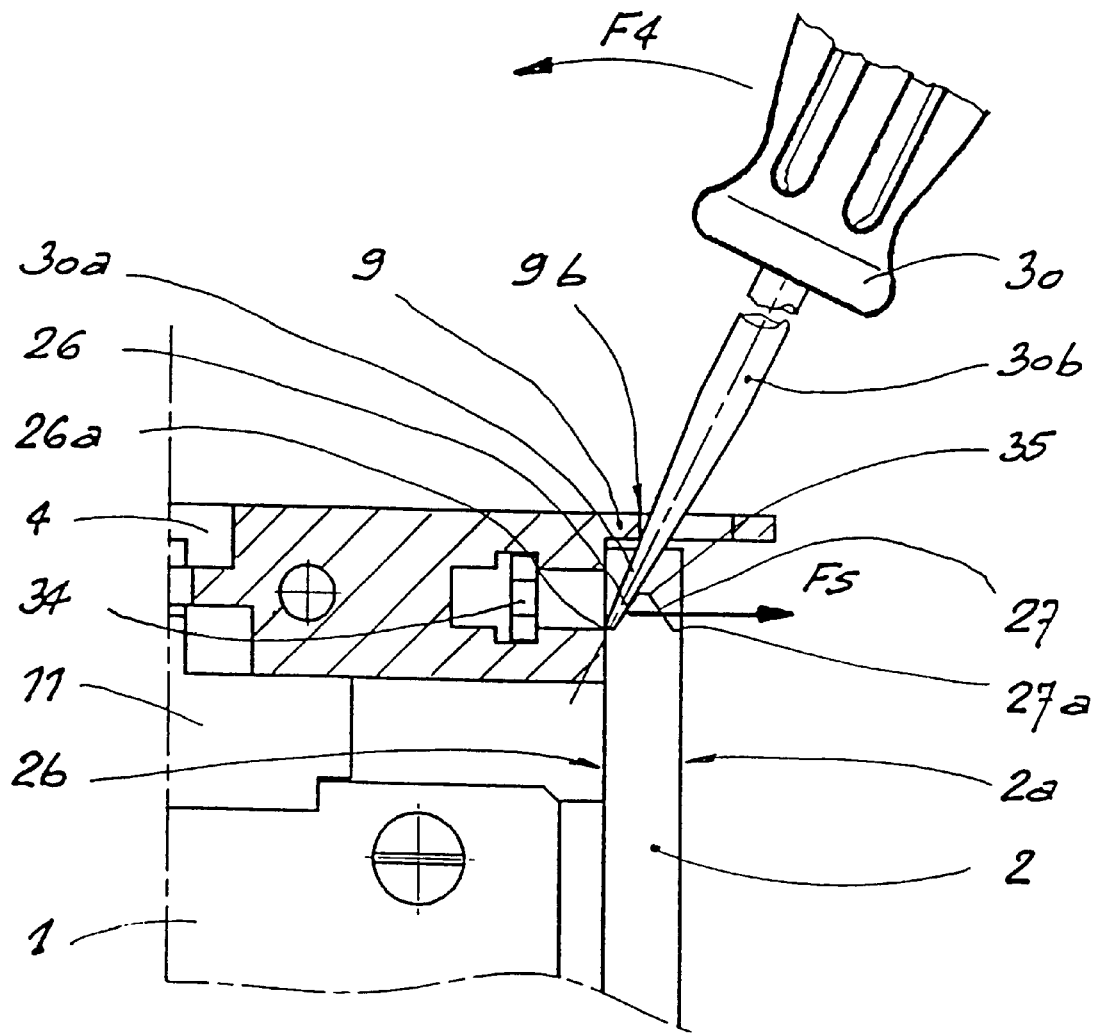
FIG. 3 is a fragmentary side view of a top portion of FIG. 1 during an initial step of being extracted from the housing.

When it is necessary to extract the card 1 from the housing 4, the screwdriver 30 is used as shown in FIG. 3 in which its shank 30*b* comes into abutment against the edge 9*b* of the notch 9*a* on the side closer to the internal volume of the housing 4, while its end 30*a* bears against the surface 26. By means of leverage analogous to the above-described leverage, tilting or pivoting the screwdriver 30, as represented by arrow $F_4$, generates a force, represented by arrow $F_5$, on the surface 26, which force is strong enough to overcome the friction generated at the connection means 3 and 6 at the beginning of the extraction during which the card 1 is extracted from the housing 4.

FIG. 3 shows the front face 2 when the card 1 is in the installed position, and it can be observed that the edge 35 that is common to the surfaces 26 and 27 is disposed substantially facing the inside edge 9*b* of the notch 9*a*, on the side closer to the internal volume of the housing 4, so that, when the card is in this position, the screwdriver can be inserted to co-operate with the surface 26 or the surface 27 as a function of the direction of the desired force for inserting or extracting the card 1.

The edge 35 is rounded to make it easier to put the end 30*a* in place "blind" in the position shown in FIG. 2 or in the position shown in FIG. 3.

Since sloping surfaces 26, 27, 28, and 29 are provided in the vicinities of the top and bottom surfaces 23 and 24 of the front face 2, the above-described method can be implemented at the top edge 23 and at the bottom edge 24, as a function of the environment of the card 1. In particular, when the housing 4 contains two superposed rows of cards, it is possible to act with a screwdriver on the top edge of the front face of a card in the top row and on the bottom edge of the front face of a card in the bottom row.

However, it is possible to provide the opening 8 in the housing 4 with a single notched bar if access to the bar is not hindered by the environment of the housing. It is necessary to act merely on one of the edges 23 or 24 of the front face 2 in order to drive the card 1.

The surfaces 26 to 29 and the margins 26*a* to 29*a* are provided in the thickness of the edges 23 and 24 and set back slightly relative to said edges, so that said surfaces and said margins are protected during handling of the card outside the housing, and so that there is no risk of them being damaged. The sloping surfaces are obtained during molding of the front face 2, and they do not modify the unit cost of such a front face.

As a result of the geometrical shapes of the surfaces 26 to 29, two side faces 36 and 37 are created respectively in the vicinity of the surfaces 26 and 27 and in the vicinity of the surfaces 28 and 29, perpendicular to the edges 23 and 24. These faces 36 and 37 make it possible to guide the end 30*a* of the screwdriver 30 by preventing said end from being positioned askew.

By means of the invention, no locking device or element remains on the front face of the card once said card is installed, it being possible for a drive member such as a screwdriver to be used to insert or to extract a very large number of cards.

The invention offers the particular advantage of being compatible with all housings that are provided with notched bars, regardless of the type and number of connection means 3 and 6, thereby making it possible to obtain very widespread standardization.

In addition, the invention makes it possible to integrate onto the surface 2*b* devices complying with the applicable standards and such as a keying system, a final centering device, and static discharge means without any major extra cost because such devices can be formed by adding or removing material, since the front face 2 is a single piece.

Figure 4:
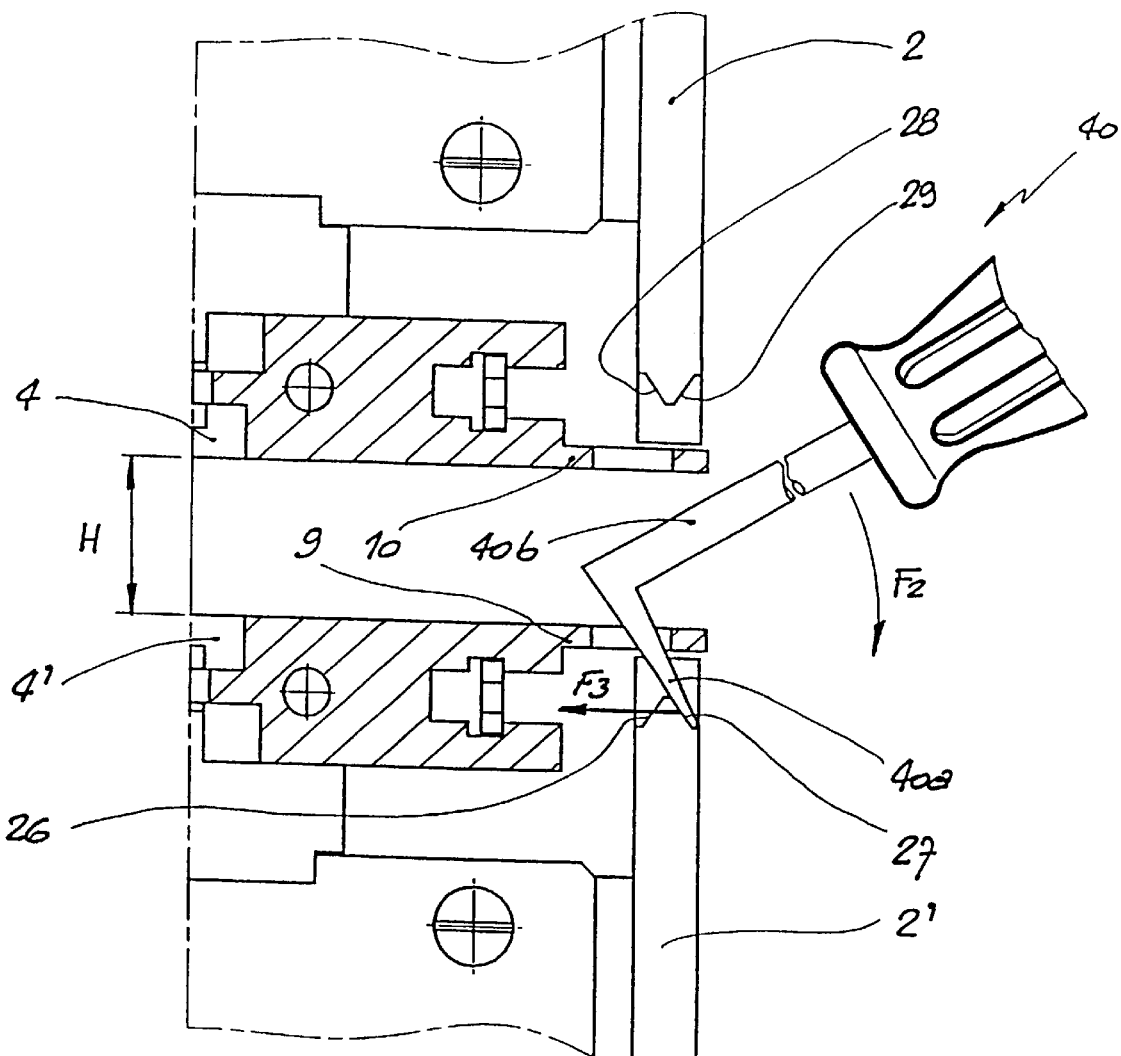
FIG. 4 is a view analogous to FIG. 2 for a second configuration of use of a card of the invention.

In the configuration shown in FIG. 4, two housings 4 and 4' are superposed. In which case, a special tool 40 is used to access the surfaces 26 and 27 of the front face 2' of a card installed in the bottom housing 4', or the bottom surfaces 28 and 29 of a front face 2 of a card installed in the top housing 4. The tool 40 comprises an end 40*a* analogous to the end of the screwdriver 30 shown in FIGS. 2 and 3, but its shank 40*b* is provided with a right-angled bend. In practice, the bend angle of the shank 40*b* is adapted to take into account the height H of the gap between the housings 4 and 4'.

In which case, the cards associated with the front faces 2 and 2' are handled mainly by acting in the gaps between the various housings, which is advantageous when the top and bottom housings abut against the top or bottom faces of a cabinet or of a box, so that it is not possible to access the top edge of a card placed in a top housing and the bottom edge of a card placed in a bottom housing.

The invention is shown with abutment surfaces 26 to 29 that are plane, i.e. adapted to match the shape of the end 30*a* of the screwdriver 30, which shape depends on the 20 shape of the head of the screw 32. If some other drive member is used, e.g. a cross-head screwdriver, the geometrical shape of the abutment surfaces can be adapted accordingly, it being possible for these surfaces to be concave.

The invention is applicable to all types of electronics cards designed to be mounted in a fixed or moving housing, in particular a drawer, a cabinet, or a box.

What is claimed is:

1. A face plate of an electronics card adapted to be inserted into a housing through an opening, at least one of the edges of the opening of the housing is provided with a notched bar having a plurality of notches, comprising:

at least one abutment surface that slopes with respect to a longitudinal plane of said face plate;

wherein said at least one abutment surface is provided on a portion of said face plate which is disposed in a vicinity of the notched bar when the electronics card is installed in the housing; and wherein said at least one abutment surface is for abutting against a drive member engaged through one of the notches when inserting the electronics card into the housing or when extracting it therefrom.

2. A face plate according to claim 1, having two abutment surfaces that slope in different directions with respect to a longitudinal plane of said face plate, one of said abutment surfaces being suitable for co-operating with said drive member for the purpose of inserting said card into said housing, the other surface being suitable for co-operating with said drive member for the purpose of extracting said card.

3. A face plate according to claim 2, wherein said two abutment surfaces slope relative to each other at an angle lying in the range 60° to 90°.

4. A face plate according to claim 3, wherein said abutment surfaces are dimensioned and positioned relative to said front surface in a manner such that a common edge that is common to said abutment surfaces is disposed substantially facing an inside edge of a notch of the bar, when the electronics card is installed in the housing.

5. A face plate according to claim 4, wherein said common edge is rounded.

6. A face plate according to claim 1, wherein the face plate is provided with at least one abutment surface at each of its ends.

7. A face plate according to claim 1, wherein said abutment surface is formed during molding of said face plate.

8. A face plate according to claim 1, wherein said abutment surface is slightly set back from a top edge or a bottom edge of said face plate, in a thickness of said face plate.

9. An electronics card designed to be put in place in a housing, said electronics card being provided with a face plate according to claim 1.

10. A faceplate according to claim 1, wherein said at least one abutment surface substantially conforms to a geometric shape of the drive member.

11. An electronics card having a face plate, in combination with a drive member and with a housing for receiving said electronics card, said housing including an opening through which said electronics card is inserted, with at least one of the edges of said opening being provided with a notched bar having a plurality of notches, said face plate of said electronics card comprising:

at least one abutment surface for abutting against said drive member;

wherein said at least one abutment surface slopes with respect to a longitudinal plane of said face plate;

wherein said at least one abutment surface is provided on a portion of said face plate which is disposed in a vicinity of said notched bar when the electronics card is installed in the housing; and wherein said drive member engages said at least one abutment surface through one of said plurality of notches when inserting said electronics card into said housing or when extracting said electronics card therefrom.

* * * * *